United States Patent [19]

Lancaster

[11] Patent Number: 4,835,584
[45] Date of Patent: May 30, 1989

[54] TRENCH TRANSISTOR

[75] Inventor: Loren T. Lancaster, Allentown, Pa.

[73] Assignee: American Telephone and Telegraph Company, AT&T Bell Laboratories, Murray Hill, N.J.

[21] Appl. No.: 27,992

[22] Filed: Mar. 16, 1987

Related U.S. Application Data

[63] Continuation of Ser. No. 675,305, Nov. 27, 1986, abandoned.

[51] Int. Cl.$^4$ .............................................. H01L 29/78
[52] U.S. Cl. ...................................... 357/23.1; 357/55
[58] Field of Search ....................... 357/55, 23.1, 23.6, 357/59

[56]  References Cited

U.S. PATENT DOCUMENTS

| | | | |
|---|---|---|---|
| 4,324,038 | 4/1982 | Chang et al. | 29/571 |
| 4,455,740 | 6/1984 | Iwai | 29/571 |
| 4,536,782 | 8/1985 | Brown | 357/23.1 |
| 4,710,790 | 12/1987 | Okamoto | 357/55 |

FOREIGN PATENT DOCUMENTS

| | | | |
|---|---|---|---|
| 0118981 | 10/1978 | Japan | 357/23.4 |
| 0125778 | 11/1978 | Japan | 357/23 HV |
| 151380 | 11/1979 | Japan | 357/23.14 |
| 55-85706 | 6/1980 | Japan | 357/23.6 |
| 228762 | 12/1984 | Japan | 357/23.14 |

OTHER PUBLICATIONS

Salama, C.A.T., "A New Short Channel MOSFET Structure (UMOST)" in *Solid State Electronics*, vol. 20, No. 12, Dec. 1977, pp. 1003–1009.
Smith, D. A. et al, "A UMOS Power Field Effect Transistor" in *Solid-State Electronics*, vol. 23, No. 6, Jun. 1980, pp. 687–692.

*Primary Examiner*—Andrew J. James
*Assistant Examiner*—Mark Prenty
*Attorney, Agent, or Firm*—John T. Rehberg

[57]  ABSTRACT

The specification describes a new MOS transistor structure in which the source gate and drain are formed within a trench in the semiconductor substrate. The gate width is determined by the depth of the trench and can be increased substantially without increasing the surface area occupied by the transistor. The result is a transistor with exceptionally high gain for a given surface area. Forming the transistor within and over a series of trenches further enhances this effect.

7 Claims, 9 Drawing Sheets

TRENCH TRANSISTOR

This application is a continuation, of application Ser. No. 675,305, filed Nov. 27, 1984 now abandoned.

BACKGROUND OF THE INVENTION

The continual shrinking of integrated circuit device packing density has recently produced a dramatic new direction for semiconductor device manufacture. That new direction is the building of device structures in three dimensions in the substrate crystal. The practical building block for these new devices is a trench structure formed into the silicon substrate. New anisotropic etching techniques make it possible to form deep trenches with steep, nearly vertical, sidewalls. Various workers have proposed the formation of trench isolation regions and trench capacitors for memory cells. A more recent, and less well known, proposal is to form trench gate structures. The latter proposal, embodied in U.S. Pat. No. 4,455,740, issued June 26, 1984 to Hiroshi Iwai, was inspired by the desire to shrink MOS transistor dimensions, bringing the source and drain ever closer together. Iwai recognized that a point is reached where the source and drain are so closely spaced that punchthrough results. Accordingly, they teach a structure in which the source to drain spacing at the surface can be shrunk without regard to punchthrough by extending the gate length into the substrate, i.e. around the bottom of a trench, thereby physically separating the source and drain effectively in the vertical rather than the horizontal dimension. Improvements in that trench gate structure are embodied in U.S. patent application Ser. No. 674,855, Filed Nov. 26, 1984 (P. T. Panousis, Case 9).

It will be recognized that the foregoing proposal is essentially a technique for extending the length of the channel of an MOS device for a given surface area. Extending the length of the device decreases the operating speed of the device and decreases the gain of the device. These implications can be traded against the benefits just described and the trench gate structure, as envisioned by Iwai, may find significant device applications.

I have discovered a different trench gate device that resembles the Iwai device only in the respect that it employs a trench. In Iwai's device the trench is the gate of the device. In the device proposed here basically the entire device is built within the trench. That is, the source and drain regions also extend into the trench in order to realize all the benefits of my discovery. Primary among these is a substantial increase in the gain of the transistor for a given surface dimension. A host of new device structures are made possible using this approach.

The marriage of a trench capacitor with a trench gate is proposed in which an entire memory cell is formed essentially in the depth dimension of the substrate.

BRIEF DESCRIPTION OF THE DRAWINGS

FIGS. 5A to 5L are schematic representations of a sequence of processing steps useful for forming the structure shown in FIG. 4;

DETAILED DESCRIPTION

Figure 1:
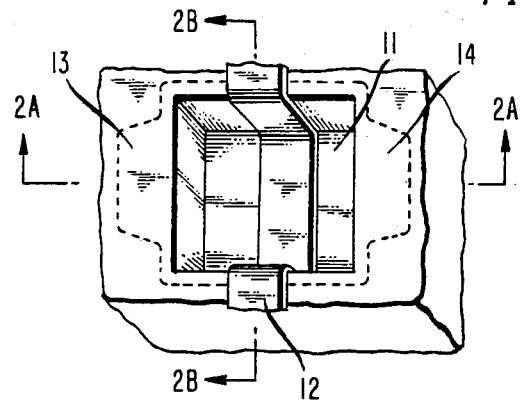
FIG. 1 is a schematic view, looking onto the top of a device constructed according to the invention.
Figure 2A:
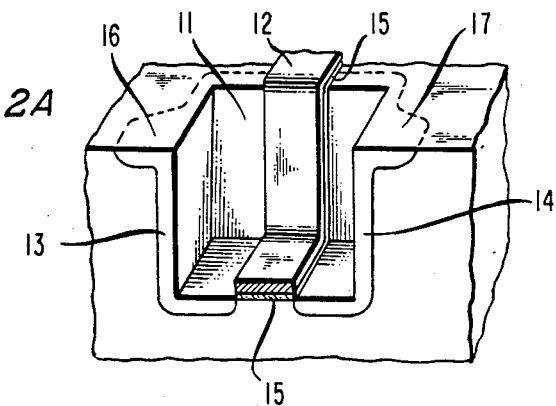
FIG. 2A and 2B are sectional views in perspective through the sections indicated in FIG. 1.
Figure 2B:
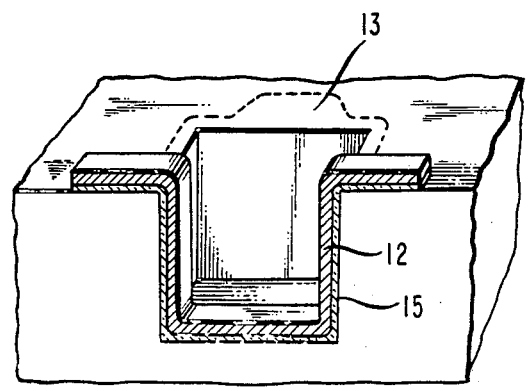
Figure 3:
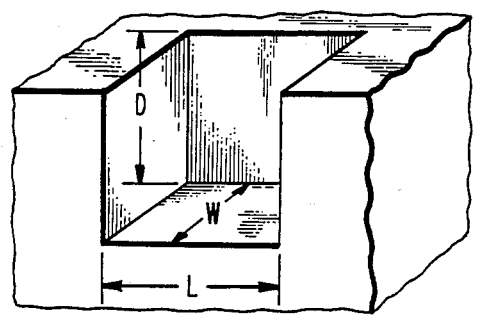
FIG. 3 is a schematic showing the dimensions used in describing the device.

The basic trench transistor structure is schematically represented by the structure shown in FIG. 1. Here a trench 11 is traversed by a gate 12. The gate separates source 13 from drain 14. The structure is shown in section in FIG. 2A and 2B. The elements designated by common numerals are the same. Also shown in FIG. 2A and 2B is gate dielectric 15. The portions 16 and 17 of the source and drain regions are provided to accommodate contact elements for source and drain contacts. The dimensions of the trench transistor are denoted W, L, and D as in FIG. 3. The view of FIG. 3 corresponds to that of FIG. 2A.

The gain of an MOS transistor is proportional to the width of the channel of the transistor divided by its length. The width dimension is the distance measured along the edge of the gate that borders the source or drain. The length dimension is the distance separating the source and drain. Typically, for maximum device packing density the width is made approximately equal to the minimum linewidth of the technology being used. Again for optimum packing density the length is often chosen to be the same as the width. However, in a variety of devices, and in particular for logic devices and memory drivers, a higher transistor gain is desirable. This results in transistor designs with gate widths many times the gate length. Such structures are realized advantageously according to the invention in which the gate width is effectively multiplied. From FIG. 2B it will be seen that the effective gate width is $W+2D$. If D is equal to W, the gate width for this device is approximately three times the width of a conventional device occupying the same surface dimensions.

Figure 4:
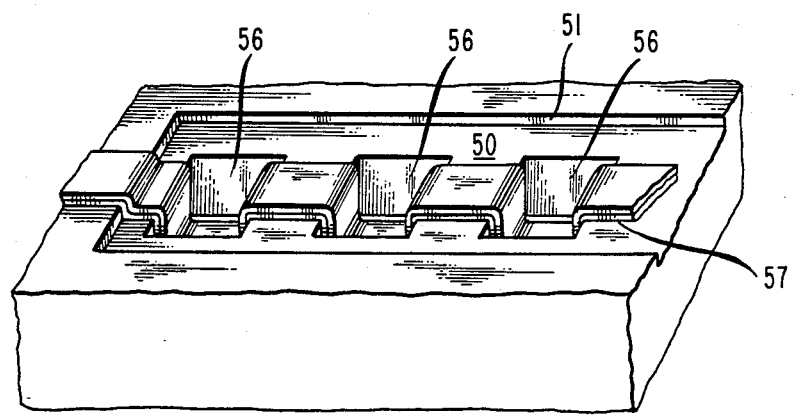
FIG. 4 is a perspective view of a multi-trench transistor according to a preferred embodiment of the invention.

The gain advantage in the transistor device of this invention can be increased by providing a multiplicity of trench gates. Such a structure is shown in FIG. 4. Here the width of the transistor is increased further using a series of trenches. This structure is recommended for high gain devices and may become the typical implementation of this invention. The advantage of the structure of FIG. 4 will be evident from the following. Assume, for example, that W, L and D (FIG. 3) are all equal to 3 $\mu$m, and the spacing between the trenches of FIG. 4 is also equal to 3 $\mu$m. The active device surface area is 3 $\mu$m by 15 $\mu$m. A standard transistor occupying this surface area would provide a gate width of 15 $\mu$. A single trench device as in FIG. 1 having a 15 $\mu$ trench width would provide a gate width of 21 $\mu$, a 40% increase. The gate width of the device of FIG. 4, having three trenches, is 33 $\mu$ or a 220% increase in gate width. As the aspect ratio of trench depth to trench width increases, the power of the inventive concept is even more evident. If the trench is 6 $\mu$ deep, the gate width for a single trench device in the example is 27 $\mu$, or nearly double the normal width (15 $\mu$). The gate width for a multiple trench device as in FIG. 4 is 51 $\mu$, more than three times the width of a conventional device.

A variety of approaches for making these devices will occur to those skilled in the art. The required technology is currently known. Three general approaches for making the devices will be described.

Figure 5A:
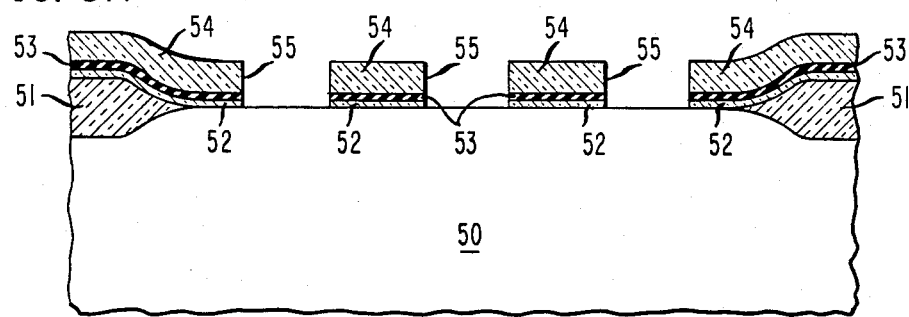
Figure 5B:
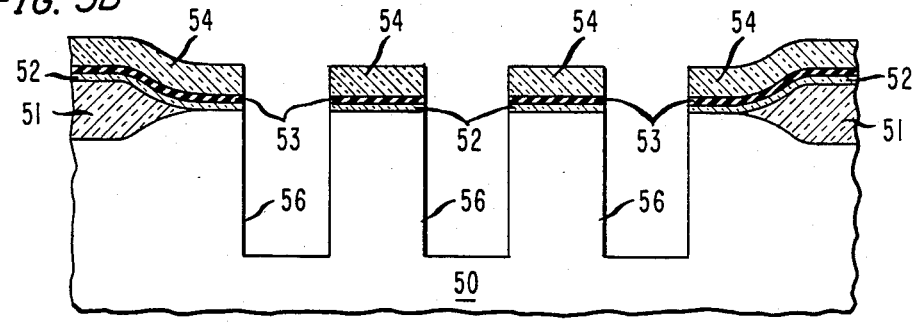
Figure 5C:
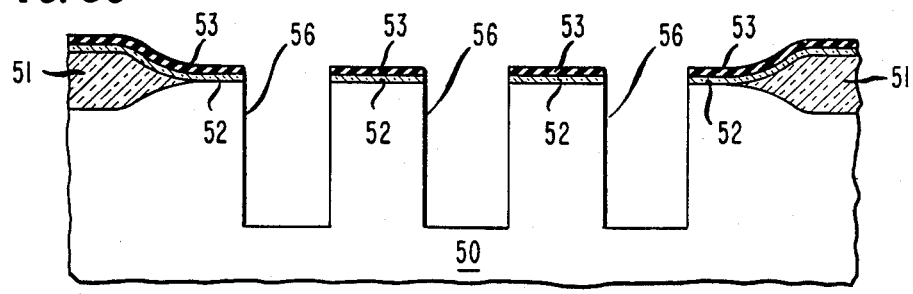
Figure 5D:
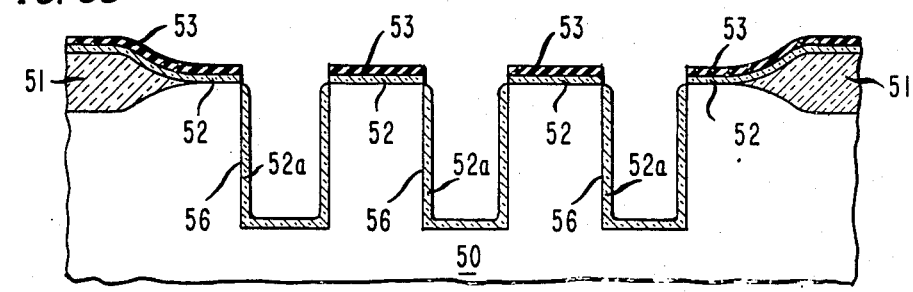
Figure 5E:
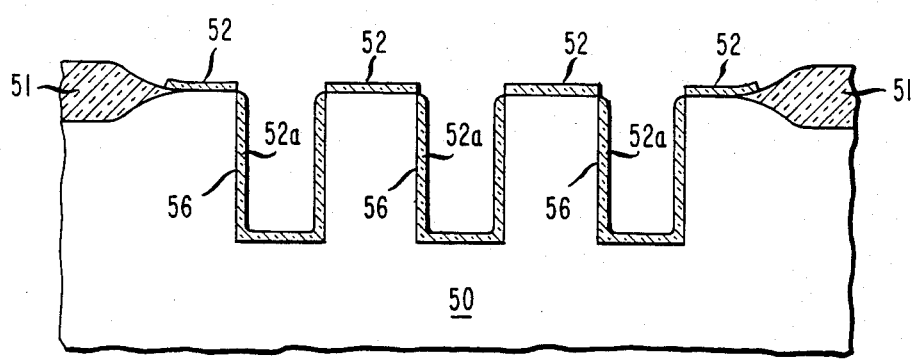
Figure 5F:
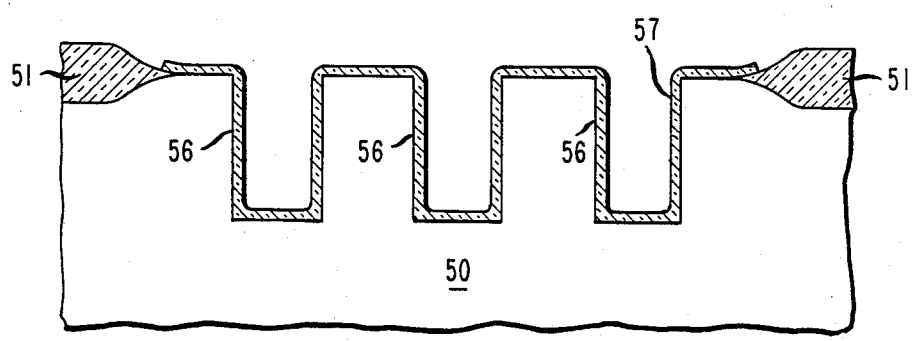

The first approach will be described in conjunction with FIGS. 4 and 5A to 5G. FIGS. 5A–5G are sectional views taken along the width W of the device and correspond in that respect with the section shown in FIG. 2B. FIG. 5A shows a semiconductor substrate 50, typically silicon, with a field oxide 51 produced in a conventional way, providing isolation around the device as shown. Formed over the substrate and field oxide is a mask layer comprising a pad oxide 52, a silicon nitride etch stop layer 53, and an oxide mask layer 54. The mask is patterned by conventional techniques, preferably by an anisotropic RIE technique, to form openings 55. An anisotropic RIE technique is used to form trenches 56 as shown in FIG. 5B. The length L of the trench (see FIGS. 2A and 3) includes the length of the gate. If we assume the gate length is the minimum dimension allowed in the technology being used, the length of the trench will be that dimension plus allowance for the source and drain regions. A suggested length in this example is 2 $\mu$ to 3 $\mu$, 1 $\mu$ for the gate and the remainder for the source/drain. This assumes a minimum design rule of 1 $\mu$. The width W and the spacing between openings are also of the order of 1 $\mu$. The depth of the trench may be selected as desired and with the dimensions described here would typically be 1 $\mu$ to 4 $\mu$. Due to the severity of the trench etch step, i.e. the damage caused to the silicon crystal, it is advantageous but not essential to "clean" the etched surfaces with standard silicon liquid etchants or by oxidizing a thin surface layer and stripping. The mask layers 52, 53, 54 may be removed at this point if desired. The oxide layer can be removed with buffered HF (FIG. 5C). The nitride layer may be removed using phosphoric acid. Since this etch may attack the silicon it is helpful to form a sacrificial oxide 52a on the trench surfaces prior to nitride removal as shown in FIG. 5D. The pad oxide 52 protects the silicon surface. After removing the nitride etch stop layer 53 as shown in FIG. 5E, both the sacrificial oxide and the pad oxide can be removed with a light buffered HF etch step.

Figure 5G:
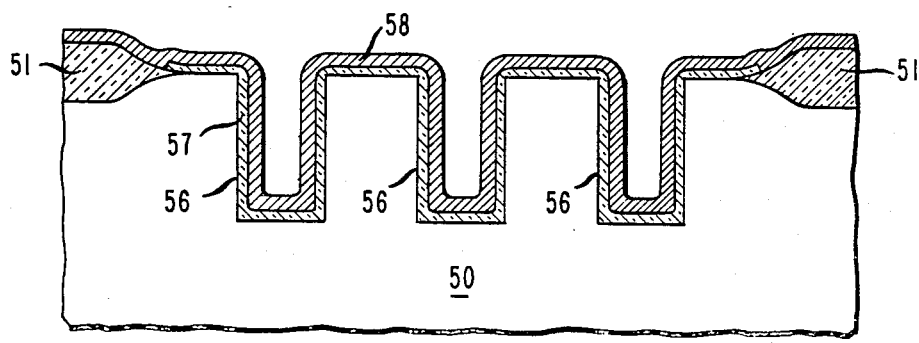

The reason for the silicon nitride etch stop is apparent here. It prevents removal of the field oxide when the trench mask layer is removed. Alternatively, the composite mask layer, or a part thereof may be left to a later stage in the process. With the substrate 50 stripped (except for FOX 51) and trenches 56 formed, the gate dielectric layer 57, typically silicon dioxide, is grown in the conventional way to produce the structure of FIG. 5F. Other dielectrics, including dual or composite layers, notably silicon dioxide and silicon nitride, can be used as well. The dimensions already mentioned suggest a gate dielectric thickness of the order of 0.02 to 0.1 $\mu$. Next, the gate electrode layer is formed by depositing polysilicon, or other appropriate conductor, e.g. polycide or refractory metal, over the whole structure and patterning to form gate electrode 58, as seen in FIGS. 4 and 5G. The patterning step is preferably performed using a bi-level or tri-level photoresist process. Such processes are now well known and have the ability to form accurate patterns in layers with severe topological variations, i.e. the so-called filler layer of the resist will fill the trenches in the topology leaving a relatively planar surface on which to project the photolithographic image. The pattern is then transferred effectively through the thick filler layer. An alternative is to fill the trench with a filler layer of, e.g. silicon dioxide, deposited e.g. using the well known TEOS process, or by low pressure CVD. The resulting structure is relatively planar, or can be etched back to planarize even further, and the photoresist layer is then applied thereover. After patterning of the gate electrode 58, the source/drain regions are formed. These may be formed by vapor phase diffusion or other appropriate techniques. If the transistor being fabricated is an n-channel device, arsine $AS_2O_3$ or their equivalent may be used to diffuse arsenic impurities into the regions abutting gate electrode 58. An oxide interlevel dielectric or passivating layer may then be formed as is standard in the art. Contact windows and contacts to source, drain and gate are formed in the usual manner.

The preferred approach among the variety of possibilities for making the trench transistor structure just described may be the use of a dielectric filler layer that is deposited in the trench and itself patterned by anisotropic etching techniques to form dual trenches to accommodate source and drain formation. This will be recognized as an adaptation of the multilevel lithography approach except that the filler layer is multifunctional. It serves as the etch mask for forming the gate electrode, a diffusion mask for forming the source and drain, and then remains in the structure as a filler to planarize the trench. The preferred materials for the filler layer are silicon dioxide and/or silicon nitride. Techniques for depositing and patterning these materials are well known, and their efficacy in this application is straightforward.

Figure 5H:
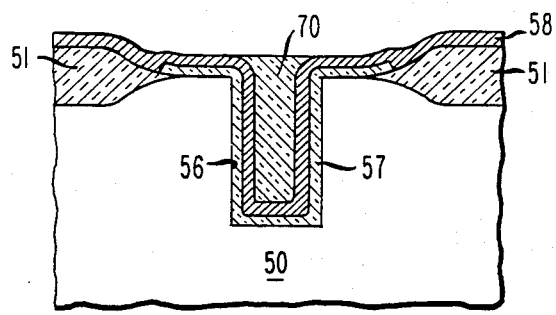
Figure 5J:
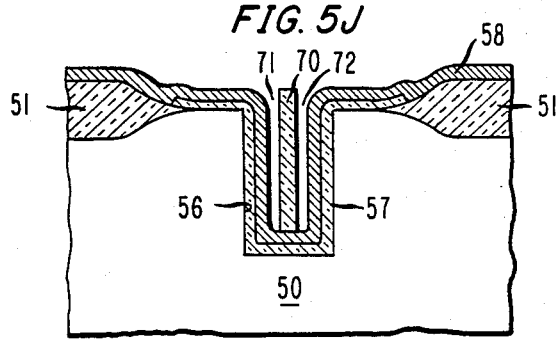
Figure 5K:
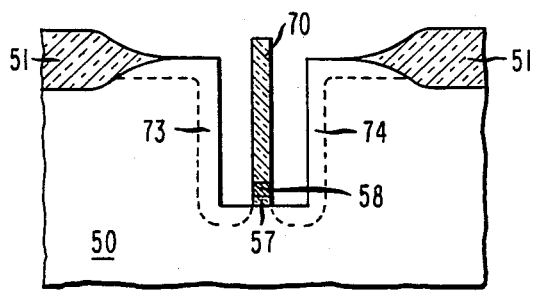
Figure 5L:
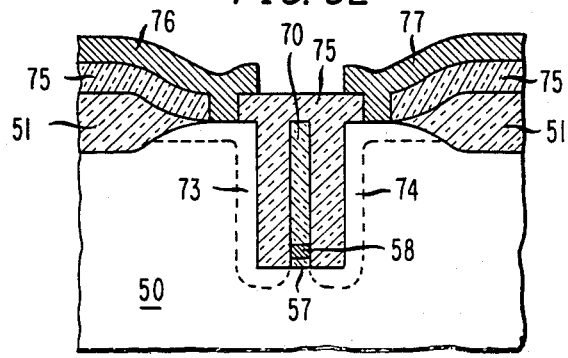

A suitable sequence of steps using this approach is shown in FIGS. 5H–5L. FIG. 5H shows the planarized dielectric filler layer 70 filling the trenches. This sectional view, and the views of FIGS. 5J–L are taken along the length L of the device and correspond to the section shown in FIG. 2A. This layer is anisotropically etched to produce source/drain trenches 71 and 72 as seen in FIG. 5J ("I" is omitted). Next the exposed polysilicon is removed leaving gate 58 as in FIG. 5K. Source/drain regions 73 and 74 are formed by diffusion or suitable means. Source/drain trenches are filled with dielectric 75 (see FIG. 5L), which may, e.g. be CVD oxide using silane, TEOS or equivalent. Source/drain contacts 76 and 77 complete the assembly.

Figure 6:
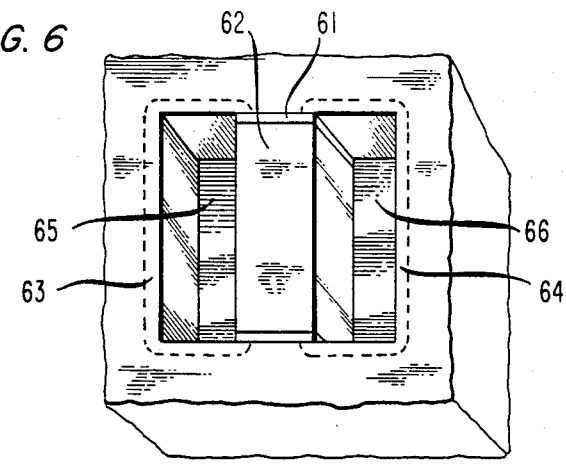
FIG. 6 is a perspective view of a modified trench transistor according to the invention.

The second general approach to fabricating the structure of the invention is described in connection with FIG. 6 and the process sequence of FIGS. 7A to 7F. These figures are sectional views similar to that of FIG. 2B. The basic structure being made is shown schematically in FIG. 6. The essential elements of the transistor, i.e. gate dielectric 61, gate electrode 62, source and drain 63 and 64 are shown. As will become evident this structure is characterized by a solid gate block filling a substantial portion of the trench, and secondary trenches 65 and 66 to accommodate formation of the source and drain regions in a manner similar to that just described in connection with FIGS. 5H to 5L. FIG. 6 shows a single trench. Multiple trenches may be used in this embodiment also. The trench appears square in plan view. However, a structure optimized for maximum gate width will have a trench width chosen to be small, e.g. the minimum allowable dimension. The length of the trench will be larger, e.g. 3× the minimum, to allow for the source/drain formation. This comment applies as well to the devices described earlier. The objective is to maximize the impact of the D dimension. The W dimension is approximately the same whether the width is at the bottom of a trench or on the surface as in a conventional structure.

Figure 7A:
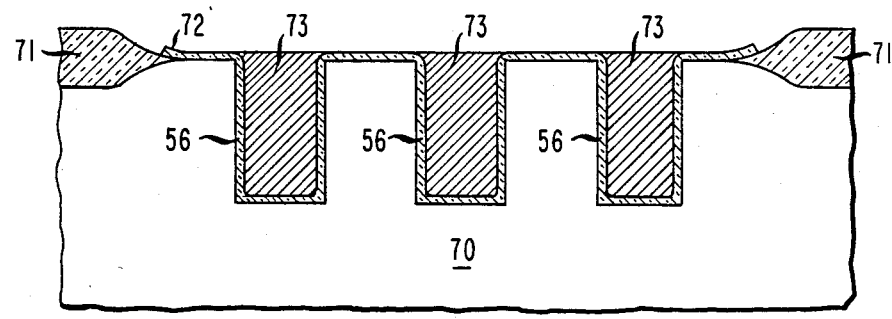
FIGS. 7A to 7F are schematic representations of a sequence of processing steps useful for forming the structure shown in FIG. 6.
Figure 7B:
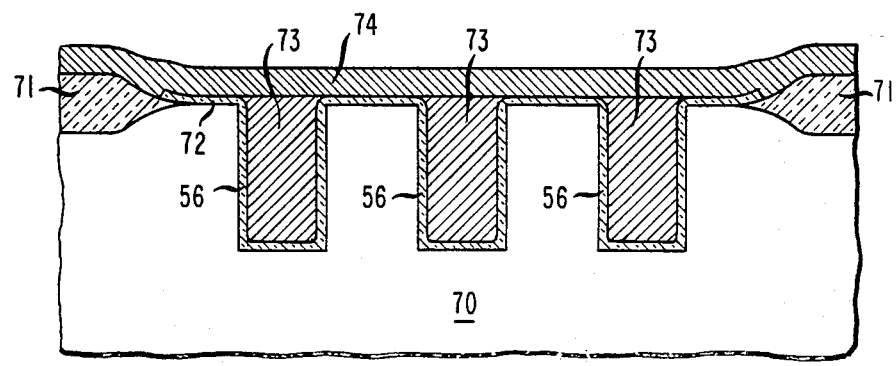

A suitable process sequence for making the device of FIG. 6 will now be described in conjunction with FIGS. 7A to 7F. The first steps in the fabrication of the structure may be the same as those described in connection with FIGS. 5A and 5B and need not be repeated. The structure of FIG. 5B is then processed by depositing a thick layer of polysilicon and then planarizing to effectively fill the trenches 56. The resulting structure is shown in FIG. 7A with substrate denoted 70, field oxide 71, gate dielectric 72, and trenches filled with polysilicon 73. Techniques for filling the trenches with polysilicon and planarizing to produce a structure like that shown are known in the art and described for example in the Iwai patent mentioned earlier. The polysilicon is preferably deposited using a CVD process, a process that produces a conformal coating. The thickness of the polysilicon initially deposited is of the order of one half the width of the trench being filled, or more to ensure complete fill. The resulting polysilicon layer may then be etched back if necessary resulting in the planar structure of FIG. 7A. A planar structure results because the surface layer clears at a point where the trench is still filled. It may be found convenient in some cases to leave the layer as deposited although the layer may be unusually thick for a surface layer. In the preferred sequence the layer is planarized to form the structure of FIG. 7A, and an interconnect layer is then deposited. This layer, 74 in FIG. 7B, is also preferably polysilicon, and interconnects the polysilicon bodies within the trenches. It also provides device interconnections, or surface regions for interlevel connections, as is standard in the art. This layer may be patterned to provide these features at this stage in the processing, but is preferably patterned at the stage represented by FIG. 7C.

Figure 7D:
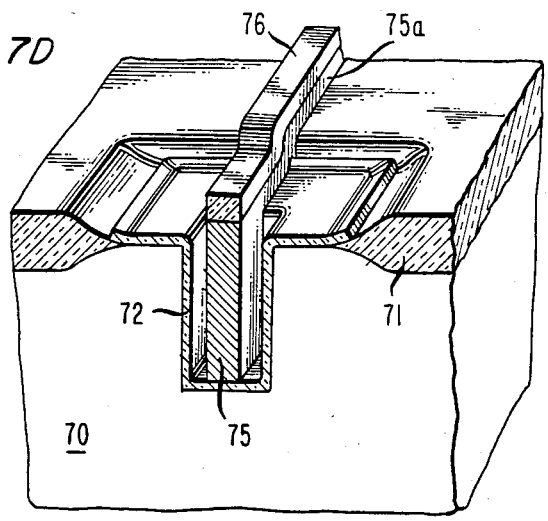
Figure 7C:
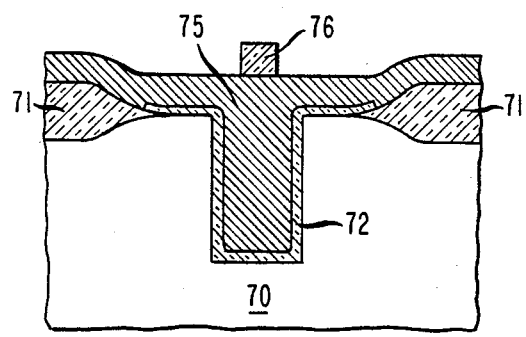
Figure 7E:
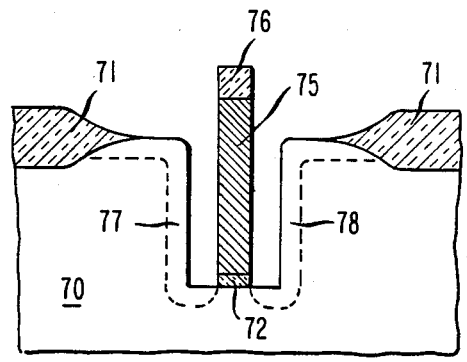
Figure 7F:
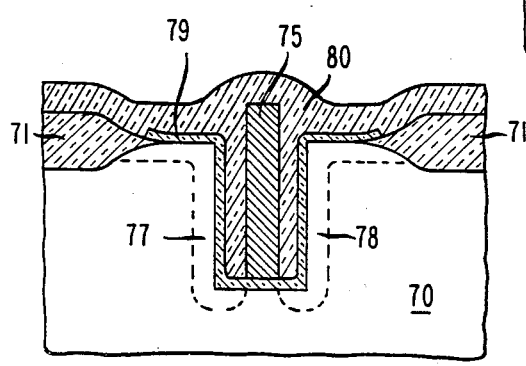

The next steps are more clearly illustrated using sectional schematics in the other dimension, i.e. sections similar to that of FIG. 2A, a cross section along the gate length rather than the width. Only one trench appears in this section. In FIG. 7C the polysilicon layer 75, here shown as if layers 73 and 74 are merged as one, is masked with a trench etch mask 76. Since field oxide 71 is protected by polysilicon layer 75, a nitride etch stop layer like 53 is not necessary. Consequently mask 76 is preferably a layer of thick silicon dioxide, e.g. 0.1 to 1.00 μm. Mask 76 is formed as shown in FIG. 7C. Layer 75 is etched anisotropically as shown in the perspective view of FIG. 7D to form the gate electrode structure, and the gate interconnect 75a. The exposed portion of the gate dielectric layer 72 may then be removed (optional) and source and drain impurity regions 77 and 78 formed, e.g. by diffusion, using e.g. arsine vapor, as shown in FIG. 7E. The mask 76 may be removed or retained as desired. A protective layer 79 is grown on the exposed silicon, FIG. 7F, and a thick silicon dioxide or doped glass layer 80 is deposited thereover to fill the remainder of the trench. Contact windows and contact layers (not shown) are made in the conventional way.

Those skilled in the art will recognize that the etch step described in connection with FIG. 7D requires effective selectivity between the material of the gate electrode, 75, and the layer 72. With the materials described, and state of the art processing, sufficient selectivity is available for forming a useful trench structure. However, if very deep trench structures are desired, more selective etch processes, or alternative sequences may be desirable. Several such proposals can be recommended. A sacrificial etch stop layer, e.g. molybdenum or other metal, can be deposited between layer 72 and layer 75 to ensure complete etching within the trench without excessively attacking the material between the trench or the unmasked border around the trench. That etch stop layer is subsequently removed except for the portion that is masked by the gate electrode. That portion becomes part of the gate. Another option is to choose a gate material that exhibits high selectivity with respect to layer 72. Although polysilicon is the preferred material for the gate electrode, other conductive materials may be found with higher selectivity to silicon dioxide or silicon nitride. Another alternative, one that is preferred for reasons that will be apparent, is to mask the surface portion of the substrate and the border portions around the trench, with a relatively durable etch mask. This approach can be implemented conveniently by leaving mask layers 52, 53, and 54 (see FIG. 5A) in place after the trench is formed, growing the gate dielectric layer 72 within the trench, and depositing layer 73 as shown in FIG. 7A. Layer 73 is etched to the bottom of the trench as shown in FIG. 7D and the surface portions are protected by etch mask 54. The upper surface portions of the transistors may thereby be rendered ineffective. However, the advantages obtained by extending the transistors in the depth dimension will outweigh the loss of the upper surface portion of the transistor.

Other schemes will be devised by workers in the art for overcoming the difficulties just described and optimizing the processing sequence. The approaches described here should be regarded as examples only.

Figure 8A:
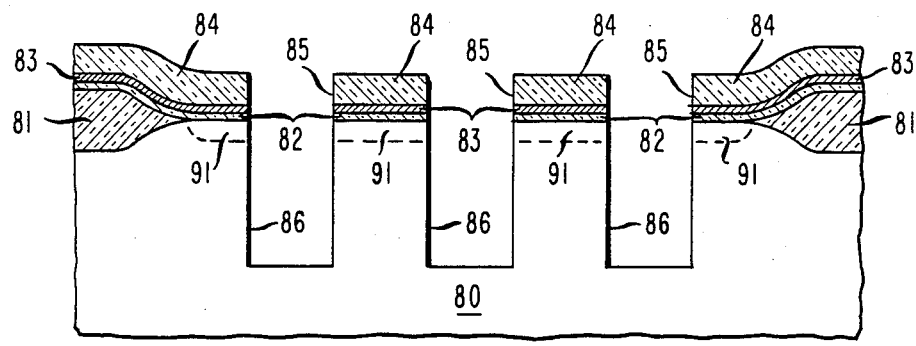
FIGS. 8A to 8F are schematic representations of an alternative sequence of steps useful for forming trench transistor structures according to the invention.
Figure 8B:
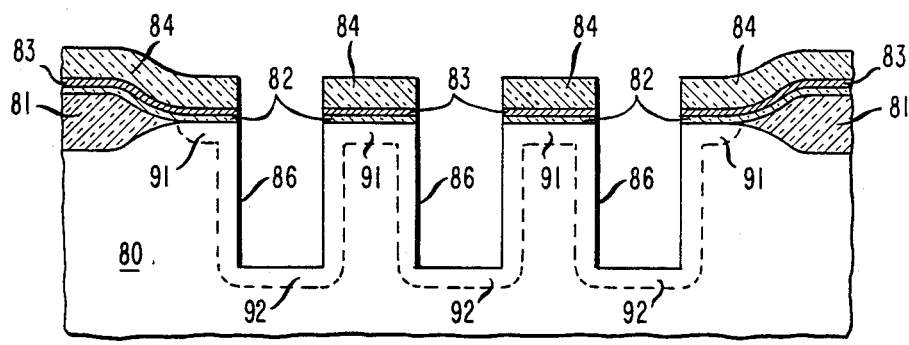
Figure 8C:
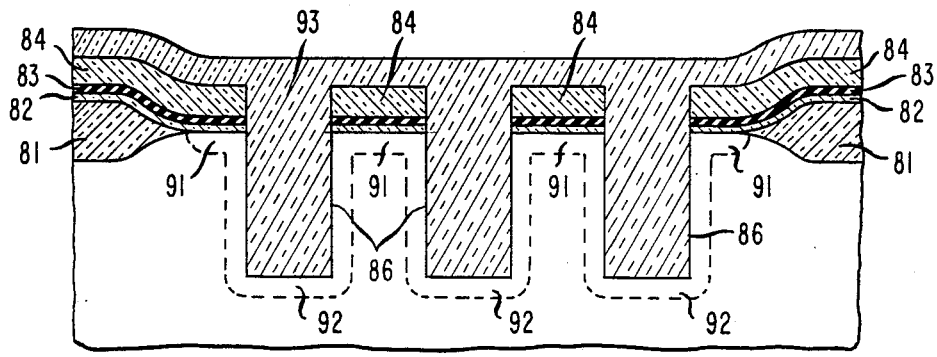
Figure 8D:
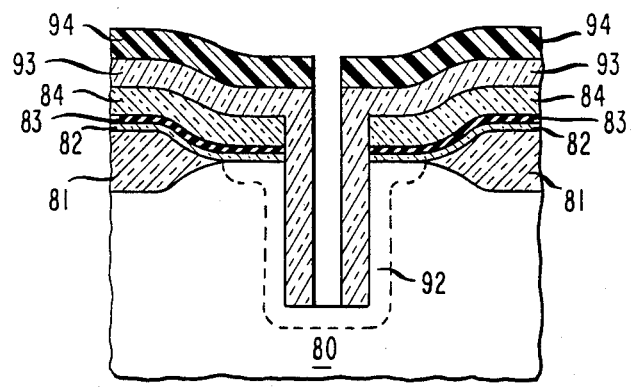
Figure 8E:
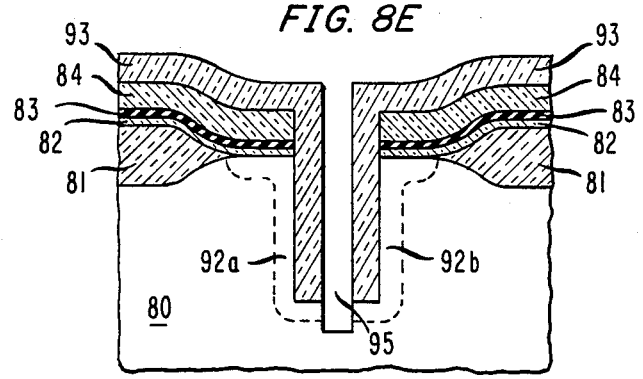
Figure 8F:
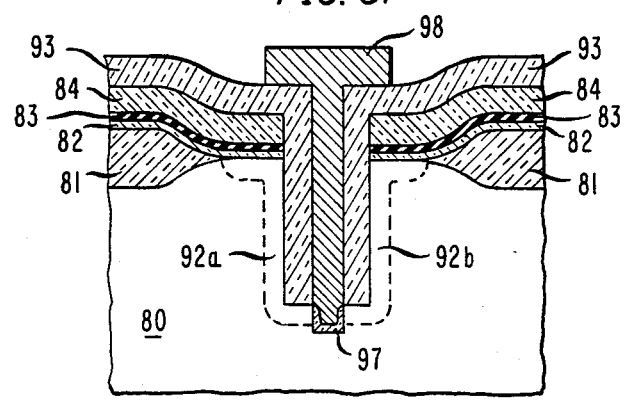

The third general approach to making the trench structures of the invention represents a departure from convention. That approach is to form the source/drain regions prior to formation of the gate. The gate is then produced by a self aligned technique that can be characterized as a trench gate within a trench transistor. This approach is illustrated in FIGS. 8A to 8F. Again the structure of FIG. 5A is the starting point with the exception that preferably a selective implant is made into appropriate regions of the substrate surface after formation of the field oxide (and chan stops or other standard isolation means) and before masking for the trench etch (82–84 of FIG. 8A). This implant, n-type for an n-channel device, will later facilitate connection to the largely buried source and drain regions as will become evident as the sequence proceeds. The surface implant is relatively heavy as is conventional for source/drain implants and is designated 91 in FIG. 8A. In the other dimension it is masked, or otherwise processed, to provide separation between source and drain. FIG. 8A otherwise is similar to FIG. 5A with numerals 50–55 changed to 80–85. FIG. 8A in addition shows the trenches 86 already etched according to a sequence described in connection with FIG. 5. The source/drain regions are then formed. As shown at 92 in FIG. 8B to connect with the surface implant 91 as shown. A thick layer of dielectric material, e.g. CVD silicon dioxide, TEOS silicon dioxide, p-glass or the like, designated 93 in FIG. 8C, is then deposited to fill the trenches 86. This layer functions primarily as a filler and may comprise one or more of a variety of materials. Although the oxides mentioned are preferred, silicon nitride, or a silicon dioxide/silicon nitride composite would also be suitable. Layer 93 may be planarized to reduce the surface thickness or so that it just, or nearly, fills trenches 86. Layer 93 is then masked by mask 94 shown in FIG. 8D, and etched to the bottom of the original trench as shown in FIG. 8D. FIGS. 8D-8F are sections taken along the length dimensions as in FIG. 2A. At this point the silicon substrate exposed in the former etch step is etched along the bottom of the trench and up the sidewalls of the trench to form a second trench 95 as shown in FIG. 8E. This trench comprises the gate structure for the device. It bisects the implant layer 92 into separate regions 92a and 92b to form the source and drain regions. The gate is completed by growing gate dielectric 97 to a thickness of a few hundred to a thousand angstroms, then depositing the gate electrode 98 to form the structure of FIG. 8F. The gate structure 98 is self-aligned to source/drain regions 92a and 92b. The gate electrode material is preferably polysilicon but may be any suitable conductor material. Since the thermal processing is essentially complete at this stage of the sequence the gate electrode may be aluminum, preferably deposited by a CVD technique to obtain complete coverage into the second trench. Additional aspects of the trench gate structure of FIG. 8F can be found in co-pending application Ser. No. 674,855, Filed Nov. 26, 1984 (P. T. Panousis, Case 9).

In the trench gate structure proposed by Iwai the bottom of the trench interconnects the channel formed along the sides of the trench. Therefore the trench bottom is an essential part of the source drain conduction path and cannot be interrupted. In the structures proposed here the advantages are due largely to the portion of the transistor that conducts along the sidewalls. The bottom of the trench is expendable. But the practical realization of certain embodiments of the trench transistors described here may suffer because of leakage or other defects associated with the bottom of the trench. The bottom may be implanted with the substrate impurity type to shut off conduction and leakage at the trench bottom. Implanting selectively into the bottom of the trench is straightforward because of the directional nature of the implant beam. The doping level need only be sufficient to reduce leakage. Alternatively a thick dielectric can be provided in the trench bottom to achieve a similar result.

Various additional modifications and deviations will occur to those skilled in the art. A wide variety of processing approaches will be found valuable in making the trench transistor structures that form the principal basis for this invention. Also a variety of variations in the structures will occur to other workers upon their exposure to these basic ideas. All such variations of these teachings that rely on the principles through which disclosure of this invention has advanced the art are properly considered as within the spirit and scope of this invention.

What is claimed is:

1. MOS transistor device comprising:
    a semiconductor substrate,
    a trench formed into said semiconductor substrate said trench comprising a first pair of oppositely disposed sidewalls, a second pair of oppositely disposed sidewalls, and a bottom,
    an MOS transistor source region extending vertically entirely along one of said first pair of sidewalls and a portion of said bottom,
    an MOS transistor drain region extending vertically entirely along the other of said first pair of sidewalls and a portion of said bottom,
    a gate dielectric layer covering said second pair of sidewalls and extending across said bottom,
    and an MOS transistor gate electrode extending along said second pair of sidewalls and extending across said bottom and having a pair of edges parallel to said first pair of sidewalls and within said trench, one edge of said pair of edges of said gate electrode overlying the edge of said source region in a portion of said bottom and the other edge of said pair of edges of said gate electrode overlying the edge of the drain region in a portion of said bottom, said source and drain regions extending along said second pair of sidewalls to said gate electrode.

2. Device of claim 1 in which the semiconductor is silicon.

3. Device of claim 1 in which the gate electrode is polysilicon.

4. Device of claim 1 further including an additional transistor device as defined in claim 1 adjacent to the first with the gate electrode of the first transistor and the gate electrode of the additional transistor merged together.

5. MOS transistor device comprising:
    a plurality of trenches formed side by side into the surface of a semiconductor substrate, said trenches comprising bottoms and first and second pairs of sidewalls,
    an MOS gate electrode structure formed continuously over the said trenches and into said trenches so as to bisect at least a pair of said trenches,
    a first impurity region formed in the substrate along one side of said gate electrode structure including the portion of the substrate extending along one sidewall of the first pair of sidewalls of the said at least a pair of trenches, said impurity region forming the source of the MOS transistor,
    and a second impurity region formed in the substrate along the opposite side of said gate electrode structure including the portion of the substrate extending along the opposite sidewall of the first pair of sidewalls of the said at least a pair of trenches, said second impurity region forming the drain of the MOS transistor, said first and second regions extending to said bottoms of said trenches and to said gate electrode structure on said second pair of sidewalls and bottom.

6. Device of claim 5 in which the said trenches are filled with dielectric material, said dielectric material being deposited after said gate electrode.

7. Device of claim 5 in which said trenches are filled with dielectric material except for the region above the gate electrode, which region is filled with gate electrode material.

* * * * *